United States Patent
Lee et al.

(10) Patent No.: US 7,679,539 B2
(45) Date of Patent: Mar. 16, 2010

(54) RANDOMIZED THERMOMETER-CODING DIGITAL-TO-ANALOG CONVERTER AND METHOD THEREFOR

(75) Inventors: Da-Huei Lee, Tainan (TW); Tai-Haur Kuo, Tainan (TW)

(73) Assignees: Megawin Technology Co., Ltd., Hsinchu (TW); National Cheng Kung University, Tainan (TW)

( * ) Notice: Subject to any disclaimer, the term of this patent is extended or adjusted under 35 U.S.C. 154(b) by 49 days.

(21) Appl. No.: 12/076,876

(22) Filed: Mar. 25, 2008

(65) Prior Publication Data

US 2009/0243904 A1 Oct. 1, 2009

(51) Int. Cl.
*H03M 1/66* (2006.01)

(52) U.S. Cl. .................................. 341/144; 341/120

(58) Field of Classification Search .................. 341/118, 341/120, 141, 143, 144, 150, 153, 154
See application file for complete search history.

(56) References Cited

U.S. PATENT DOCUMENTS

| | | | |
|---|---|---|---|
| 5,404,142 A * | 4/1995 | Adams et al. ................ | 341/144 |
| 6,466,147 B1 | 10/2002 | Jensen et al. | |
| 6,819,276 B1 * | 11/2004 | Hossack ...................... | 341/143 |
| 7,079,063 B1 * | 7/2006 | Nguyen et al. .............. | 341/144 |
| 2004/0017304 A1 * | 1/2004 | Heizmann et al. ........... | 341/144 |

OTHER PUBLICATIONS

Da-Huei Lee and Tai-Haur Kuo, Advancing Data Weighted Averaging Technique for Multi-Bit Sigma-Delta Modulators, IEEE Transactions on Circuits and Systems-II: Express Briefs, vol. 54, No. 10, Oct. 2007, pp. 838-842.
Da-Huei Lee, Yu-Hong Lin and Tai-Haur Kuo, Nyquist-Rate Current-Steering Digital-to-Analog Converters with Random Multiple Data-Weighted Averaging Technique and QN Rotated Walk Switching Scheme, IEEE Transactions on Circuits and Systems-II: Express Briefs, vol. 53. No. 11, Nov. 2006, pp. 1264-1268.

* cited by examiner

*Primary Examiner*—Brian Young
(74) *Attorney, Agent, or Firm*—Rosenberg, Klein & Lee

(57) ABSTRACT

A randomized thermometer-coding digital-to-analog converter (DAC) for the reduction of harmonic distortion due to non-ideal circuit mismatch is presented. The present invention introduces a new dynamic element matching technique that contains three properties of randomization, consecutive selection and less element switching activity to achieve good spurious-free dynamic range and small maximum output error. The topology uses a bank of 1-bit DAC elements, whose outputs are summed to produce a multi-level analog output. The binary digital input is encoded to be thermometer code. During a randomization period, the thermometer code is barrel-shifted to a specific starting position where the position is generated randomly. Thus, the DAC noise is randomized with less element switching activity and consecutive selection.

12 Claims, 5 Drawing Sheets

RANDOMIZED THERMOMETER-CODING DIGITAL-TO-ANALOG CONVERTER AND METHOD THEREFOR

FIELD OF THE INVENTION

The present invention relates to a digital-to-analog converter and, in particular, to a digital-to-analog converter employing dynamic element matching techniques.

BACKGROUND OF THE RELATED ART

High-speed high-resolution digital-to-analog converters (DACs) are increasingly used for wired and wireless communication, direct digital synthesis and video signal processing. The main requirements of the DACs for these applications are high spectral-purity and small output errors. Trimming and calibration have been used to decrease element mismatches and result in high spurious-free dynamic ranges (SFDRs) and small maximum output errors. Alternatively, dynamic element matching (DEM) has been successfully applied to reduce the correlation of DAC noise to the input signal for achieving high SFDRs. For Nyquist-rate DACs, randomization is mostly used to suppress the harmonics. However, the possible maximum output errors of randomization are still large because the elements are selected randomly. Data weighted averaging (DWA), another DEM technique, is widely used for oversampling-rate ADCs and DACs. Random multiple data weighted averaging (RMDWA), one of the DWA-like techniques, was first proposed to be applied for Nyquist-rate DAC applications. With RMDWA, which has consecutive selection and randomization properties, the Nyquist-rate current-steering DAC structure can achieve both benefits of DEM techniques and proper layout switching schemes.

However, the increased switching activity of DWA-like techniques results in more dynamic errors. In order to keep the two properties and further decrease the switching activity, the present invention is proposed. The present invention proposes a new DEM technique suitable for the applications requiring high SFDR DACs. It is shown that harmonic distortions are suppressed with less switching activity.

SUMMARY OF THE INVENTION

It is an object of this invention to provide a digital-to-analog converter and method, which can reduce the errors of the analog output and enhance the spectral purity.

The digital-to-analog converter in accordance with the invention generates an analog output signal from digital input signals by using a bank of 1-bit DAC elements. The binary digital input signals are translated to be thermometer codes for the randomization encoder. The encoder implements a randomization algorithm that barrel shifts the thermometer code to a specific starting position during each randomization period. The encoder output signals are used to drive the bank of 1-bit DAC elements. The analog outputs of the bank of 1-bit DAC elements are connected through a summing node to generate the DAC analog output signal corresponding to the original digital input signals.

DETAILED DESCRIPTION OF THE INVENTION

Figure 1:
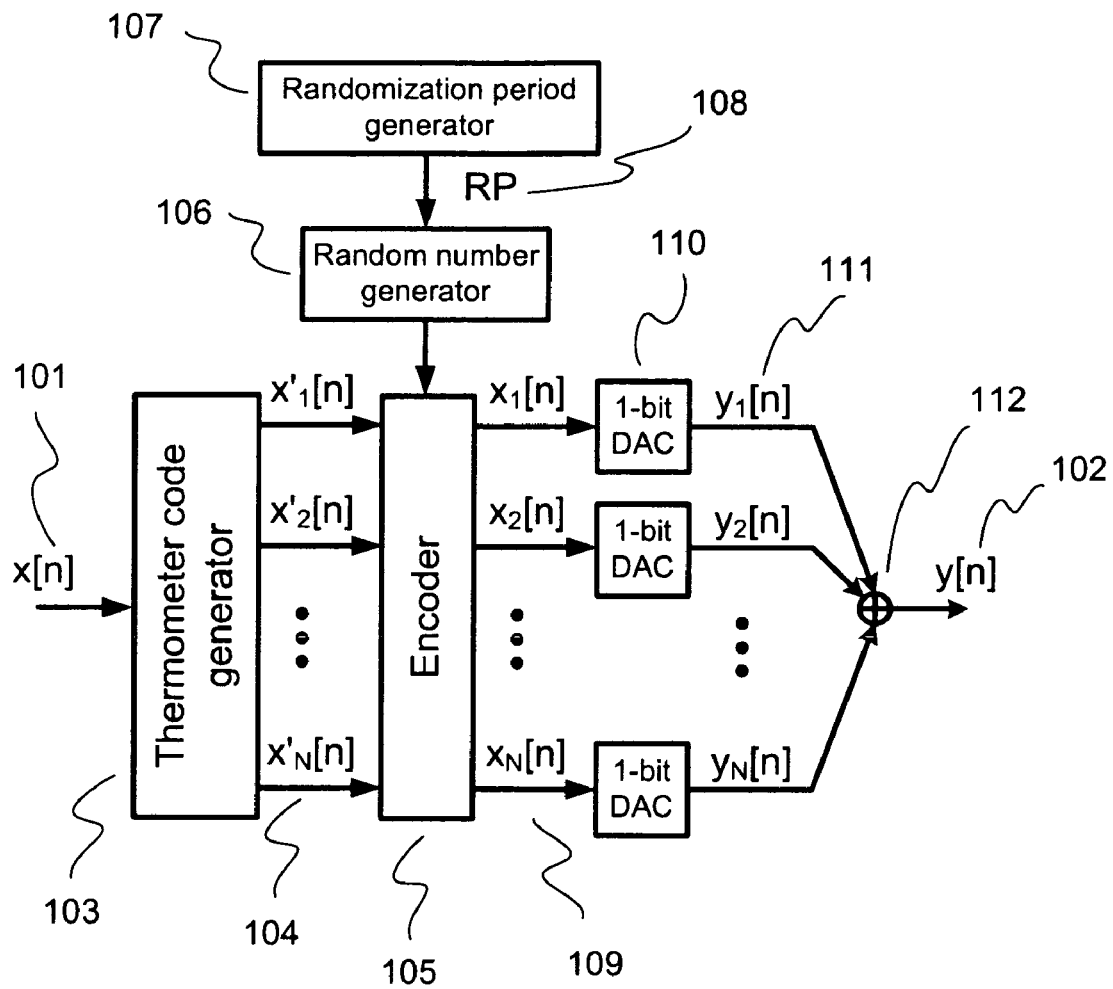
FIG. 1 illustrates the block diagram of an M-bit, N-level DAC according to this invention.

An example of an M-bit DAC block diagram of the present invention is shown in FIG. 1, wherein a digital input signal 101 is provided and an analog output signal 102 is produced. The M-bit digital input signal x[n] 101 is applied to a thermometer code generator 103. The thermometer code generator 103 translates the M-bit digital input signal x[n] 101 to be an N-level thermometer code $\{x'_1[n], x'_2[n], \ldots, x'_N[n]\}$ 104 that is fed into an encoder 105.

It is obvious that the thermometer code generator 103 can be removed when the input has been the N-level thermometer code $\{x'_1[n], x'_2[n], \ldots, x'_N[n]\}$ 104. The encoder 105, such as a barrel shifter, barrel shifts the N-level thermometer code $\{x'_1[n], x'_2[n], \ldots, x'_N[n]\}$ 104 to a specific starting position.

A random number generator 106 generates a random number and sends the random number to the encoder to decide the specific starting position.

A randomization period generator 107 produces a randomization period (RP) 108 and sends the RP 108 to the random number generator 106. The RP 108 controls the encoder shifting the N-level thermometer code $\{x'_1[n], x'_2[n], \ldots, x'_N[n]\}$ 104 to the same starting position during RP 108 samples of M-bit digital input x[n] 101. The RP 108 can be 1 or a number larger than 2, and, moreover, it can be a constant or a variable. Furthermore, the element switching activity can be decreased to the minimum by properly arranging the random number and/or the RP 108 for minimum element switching noise according to this invention.

The output $\{x_1[n], x_2[n], \ldots, x_N[n]\}$ 109 of the encoder 105 is fed into a plurality of DAC elements 110 to generate respective analog outputs $\{y_1[n], y_2[n], \ldots, y_N[n]\}$ 111. An analog output summing node 112 receives the respective analog outputs $\{y_1[n], y_2[n], \ldots, y_N[n]\}$ 111 of the plurality of the DAC elements 110 to generate the analog output signal 102 of summing the respective analog outputs $\{y_1[n], y_2[n], \ldots, y_N[n]\}$ 111.

With non-zero static mismatch errors, the output of the DAC can be written as:

$$y[n] = \alpha x[n] + \beta + e[n],$$

where $\alpha$ is a constant gain error, $\beta$ is a DC offset error, and $e[n]$ is DAC noise when the gain error and offset error are removed. The form of $e[n]$ can be re-written as $$e[n] = w[n]x[n],$$

where $w[n]$ is a process with characteristic determined by the encoder which produces the input codes for the plurality of digital-to-analog converter elements. In accordance with the usual definitions, the time-average mean and autocorrelation of input sequence x[n] can be defined as $$\overline{M}_x = \lim_{P \to \infty} \frac{1}{P} \sum_{n=1}^{P} x[n] \text{ and}$$

$$\overline{R}_{xx}[k] = \lim_{P \to \infty} \frac{1}{P} \sum_{n=1}^{P} x[n]x[n+k].$$

Therefore, the autocorrelation of output signal y[n] can be derived as $$\overline{R}_{yy}[k] = \alpha^2 \overline{R}_{xx}[k] + 2\alpha\beta\overline{M}_x + \beta^2 + \overline{\sigma}^2 \delta[k],$$

if e[n] is zero-mean, white random process, i.e. w[n] is a random process being zero-mean, white and uncorrelated with x[n].

Figure 2:
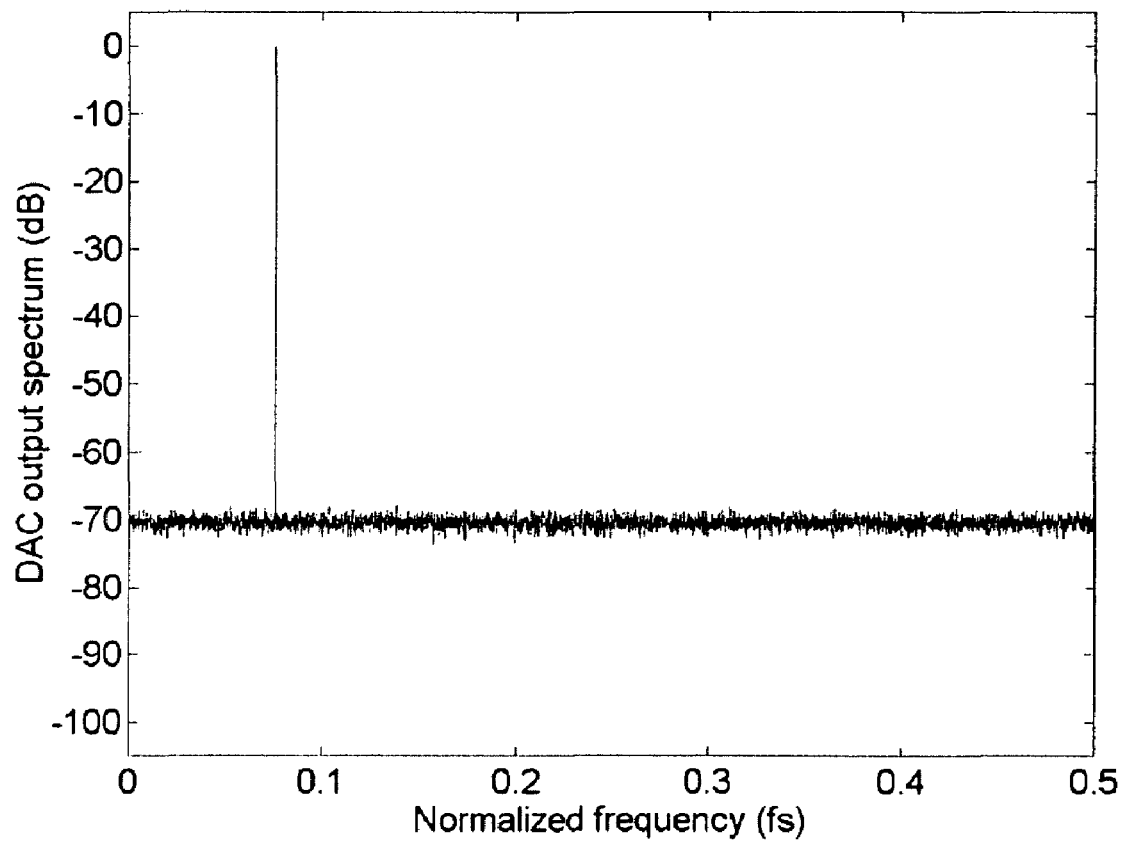
FIG. 2 provides the simulated analog output spectrum relative to a 6-bit, 64-level DAC with dithered sinusoidal digital input and no mismatch errors.
Figure 3:
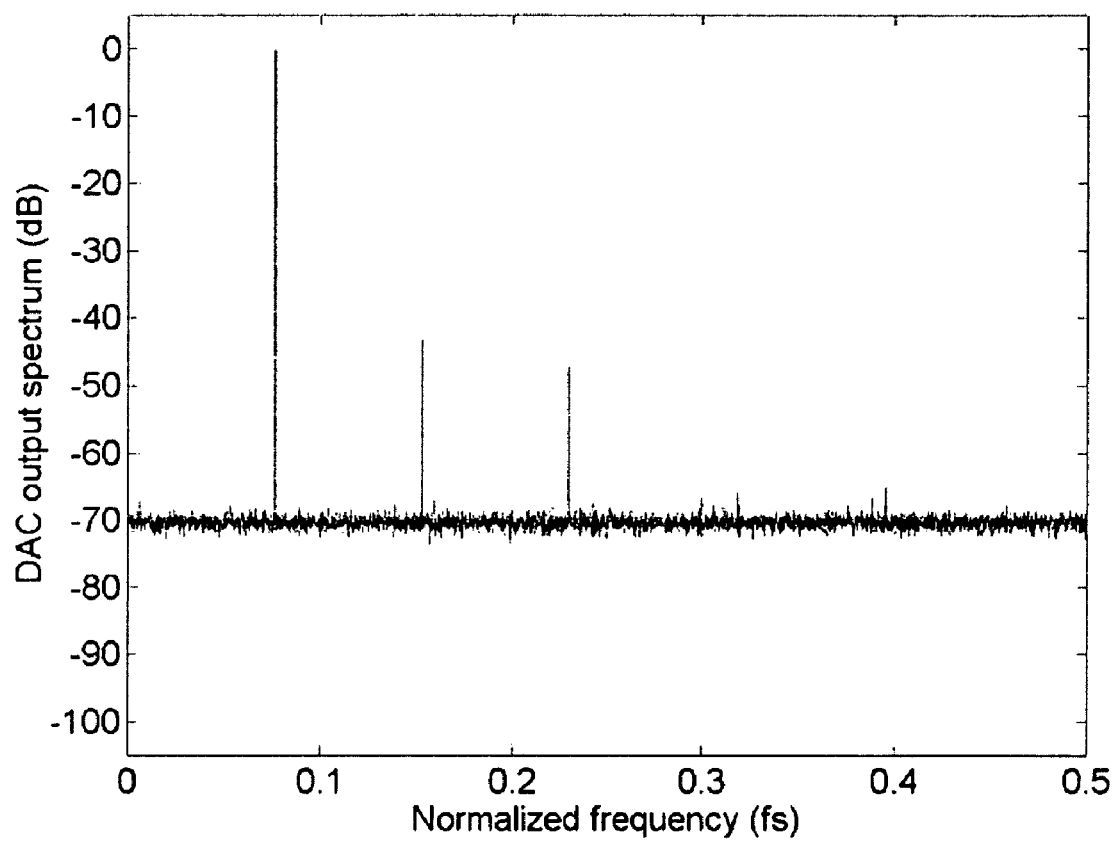
FIG. 3 provides the simulated analog output spectrum relative to a 6-bit, 64-level DAC applying no DEM with dithered sinusoidal digital input and mismatch errors.
Figure 4:
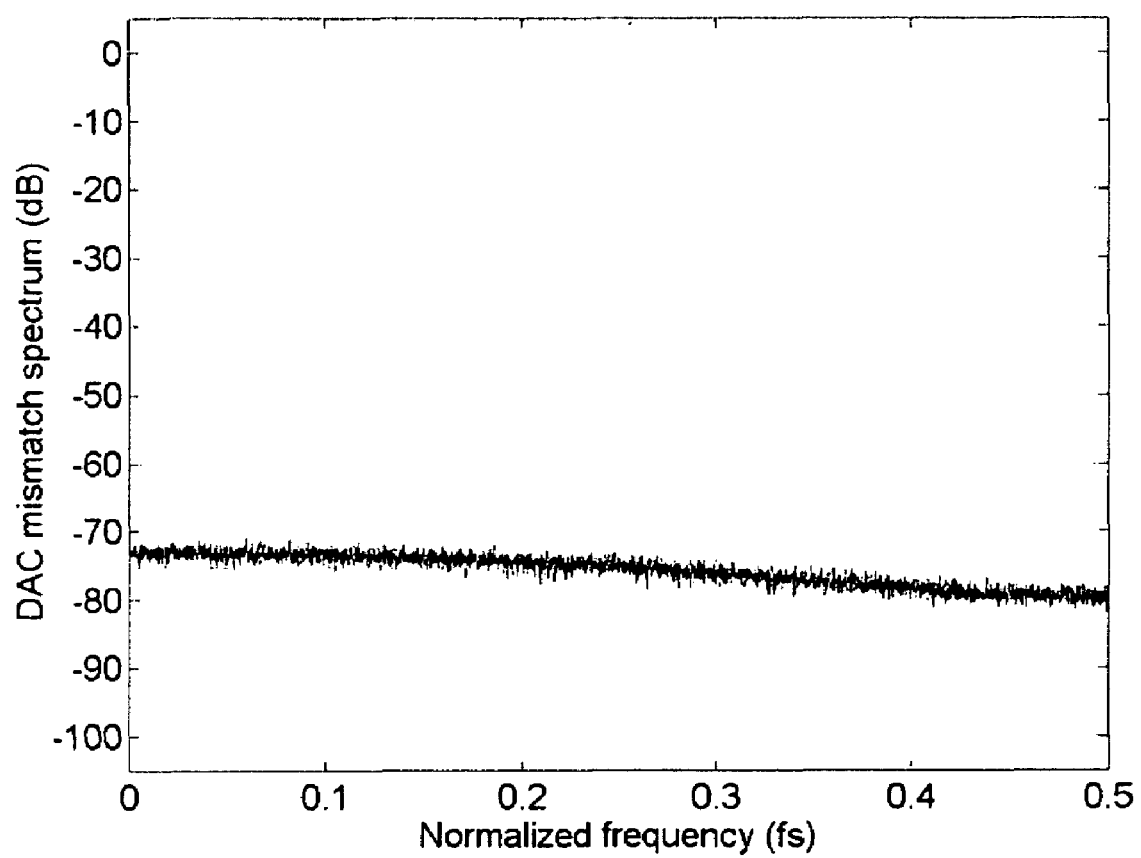
FIG. 4 provides the simulated mismatch spectra, which is the difference between the digital input signal and the analog output signal, relative to the 6-bit, 64-level DAC with mismatch errors and dithered sinusoidal digital input, wherein the DAC uses the technique provided by the present invention with a randomization period of 2.
Figure 5:
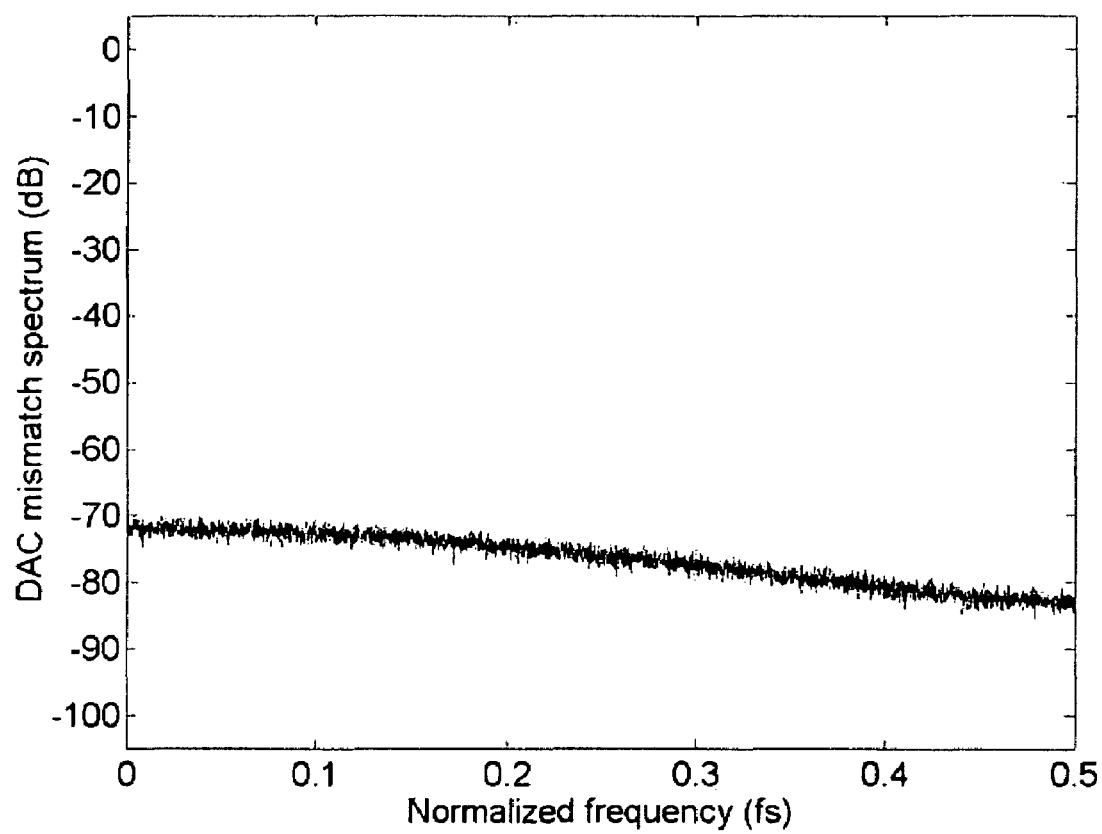
FIG. 5 provides the simulated mismatch spectra, which is the difference between the digital input signal and the analog output signal, relative to the 6-bit, 64-level DAC with mismatch errors and dithered sinusoidal digital input, wherein the DAC uses the technique provided by the present invention with a randomization period of 4.

Choosing M=6 and N=64 for the block diagram in FIG. 1, it demonstrates the use of the present invention for a 6-bit, 64-level DAC embodiment. Thus, the number of the bank of 1-bit DAC elements is 64. The simulated performance of the chosen example DAC is presented in FIG. 2, FIG. 3, FIG. 4, and FIG. 5. All the simulated results are obtained by averaging 32 periodograms, and each periodogram corresponds to $2^{13}$ samples. A full-scale dithered sinusoid with a frequency of (313/4096) sampling frequency is applied to the DAC. The dither sequence is a white sequence with a triangular probability density function distributed on $(-\Delta, \Delta)$ where $\Delta$ is the step-size of the DAC. FIG. 2 shows the output spectrum of the DAC with no static mismatch errors. FIG. 3 shows the output spectrum of the DAC with static mismatch errors but without dynamic element matching. FIG. 4 and FIG. 5 show the difference between the input and output signals of the DAC with static mismatch errors and dynamic element matching provided by the present invention with a randomization period of 2 and 4, respectively. The whitened mismatch spectra are slightly affected by the different values of the randomization period.

In these simulations, the static mismatch errors were generated from a profile with joint error distribution (50% linear+ 50% quadratic) with 3.3% standard deviation of the nominal LSB value of the DAC. Without dynamic element matching, the harmonic distortions resulted from the static mismatch errors are distributed across the spectrum in FIG. 3, resulting in a SFDR of less than 43 dB. These harmonic distortions are largely suppressed by the present invention as shown in FIG. 4 and FIG. 5.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A randomized thermometer-coding digital-to-analog converter for converting an N-level thermometer coded digital input to an analog output, comprising:
    an encoder which barrel shifts said N-level thermometer coded digital input to a specific starting position;
    a random number generator which generates a random number and sends said random number to said encoder to decide said specific starting position;
    a randomization period generator which produces a randomization period and sends said randomization period to said random number generator, wherein said randomization period controls said encoder to shift said N-level thermometer coded digital input to said specific starting position during said randomization period;
    a plurality of digital-to-analog converter elements which receive the outputs of said encoder to generate respective analog outputs; and
    an analog output summing node which receives and sums said respective analog outputs to generate said analog output.

2. The randomized thermometer-coding digital-to-analog converter in claim 1, wherein said encoder is a barrel shifter.

3. The randomized thermometer-coding digital-to-analog converter in claim 1, wherein said randomization period is equal to 1.

4. The randomized thermometer-coding digital-to-analog converter in claim 1, wherein said randomization period is not less than 2.

5. The randomized thermometer-coding digital-to-analog converter in claim 1, wherein said randomization period is a constant or a variable.

6. The randomized thermometer-coding digital-to-analog converter in claim 1, wherein said randomization period and/ or said specific starting position are/is arranged to achieve minimum element switching activity.

7. A randomized thermometer-coding digital-to-analog converter for converting an M-bit digital input to an analog output, comprising:
    a thermometer code generator which receives said M-bit digital input to produce a corresponding N-level thermometer code;
    an encoder receiving said thermometer code generator and barrel shifting said corresponding N-level thermometer code to a specific starting position;
    a random number generator which generates a random number and sends said random number to said encoder to decide said specific starting position;
    a randomization period generator which produces a randomization period and sends said randomization period to said random number generator, wherein said randomization period controls said encoder to shift said corresponding N-level thermometer code to said specific starting position during said randomization period;
    a plurality of digital-to-analog converter elements which receive the outputs of said encoder to generate respective analog outputs; and
    an analog output summing node which receives and sums said respective analog outputs to generate said analog output.

8. The randomized thermometer-coding digital-to-analog converter in claim 7, wherein said encoder is a barrel shifter.

9. The randomized thermometer-coding digital-to-analog converter in claim 7, wherein said randomization period is equal to 1.

10. The randomized thermometer-coding digital-to-analog converter in claim 7, wherein said randomization period is not less than 2.

11. The randomized thermometer-coding digital-to-analog converter in claim 7, wherein said randomization period is a constant or a variable.

12. The randomized thermometer-coding digital-to-analog converter in claim 7, wherein said randomization period and/or said specific starting position are/is arranged to achieve minimum element switching activity.

* * * * *